US 12,293,905 B2

United States Patent
Aoyagi et al.

(10) Patent No.: US 12,293,905 B2
(45) Date of Patent: May 6, 2025

(54) CATHODE UNIT FOR MAGNETRON SPUTTERING APPARATUS AND MAGNETRON SPUTTERING APPARATUS

(71) Applicant: ULVAC, INC., Kanagawa (JP)

(72) Inventors: Toshiya Aoyagi, Kanagawa (JP); Makoto Arai, Kanagawa (JP); Satoru Takasawa, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 56 days.

(21) Appl. No.: 17/928,510

(22) PCT Filed: Mar. 18, 2022

(86) PCT No.: PCT/JP2022/012539
§ 371 (c)(1),
(2) Date: Nov. 29, 2022

(87) PCT Pub. No.: WO2022/244443
PCT Pub. Date: Nov. 24, 2022

(65) Prior Publication Data
US 2023/0207295 A1 Jun. 29, 2023

(30) Foreign Application Priority Data
May 21, 2021 (JP) ................. 2021-086124

(51) Int. Cl.
*H01J 37/34* (2006.01)
*C23C 14/34* (2006.01)
*C23C 14/35* (2006.01)

(52) U.S. Cl.
CPC ...... *H01J 37/3405* (2013.01); *C23C 14/3407* (2013.01); *C23C 14/35* (2013.01); *H01J 37/3455* (2013.01)

(58) Field of Classification Search
CPC ............... H01J 37/3405; H01J 37/3455; H01J 37/3408; H01J 37/345; H01J 37/3452;
(Continued)

(56) References Cited

U.S. PATENT DOCUMENTS 6,358,376 B1 * 3/2002 Wang .................. H01J 37/3441
204/192.12
6,495,009 B1 12/2002 Gung
(Continued)

FOREIGN PATENT DOCUMENTS

JP 2008-163451 A 7/2008
JP 2011-179068 A 9/2011

OTHER PUBLICATIONS

International Search Report for PCT Patent App. No. PCT/JP2022/012539 (May 24, 2022).

*Primary Examiner* — James Lin
*Assistant Examiner* — Patrick S Ott
(74) *Attorney, Agent, or Firm* — Future IP LLC; Tomoko Nakajima

(57) ABSTRACT

A cathode unit includes first and second magnet units that are driven to rotate around an axis on a side opposed to a sputtering surface of a target. The first magnet unit is configured to cause a first leakage magnetic field to act on a space in front of the sputtering surface including a target center inward. The second magnet unit is configured to cause a second leakage magnetic field to act locally in the space in front of the sputtered surface located between the target center and the outer edge of the target and to enable self-holding discharge under low pressure of plasma confined by the second leakage magnetic field.

8 Claims, 2 Drawing Sheets

(58) Field of Classification Search
CPC ... C23C 14/3407; C23C 14/35; C23C 14/358; H05H 1/46
See application file for complete search history.

(56) References Cited

U.S. PATENT DOCUMENTS

| | | |
|---|---|---|
| 7,767,064 B2 | 8/2010 | Pavloff et al. |
| 2005/0133365 A1* | 6/2005 | Hong ................... C23C 14/35 204/298.03 |
| 2006/0060470 A1 | 3/2006 | Gung |
| 2006/0065525 A1* | 3/2006 | Weichart ............. C23C 14/35 204/298.26 |
| 2015/0075970 A1* | 3/2015 | Miller ................... C23C 14/35 204/192.12 |
| 2021/0207261 A1* | 7/2021 | Ishibashi ............ H01J 37/3405 |

\* cited by examiner

CATHODE UNIT FOR MAGNETRON SPUTTERING APPARATUS AND MAGNETRON SPUTTERING APPARATUS

This application is a national phase entry under 35 U.S.C. § 371 of PCT Patent Application No. PCT/JP2022/012539, filed Mar. 18, 2022, which claims priority under 35 U.S.C. § 119 to Japanese Patent Application No. 2021-086124, filed May 21, 2021, which are incorporated by reference.

TECHNICAL FIELD

The present invention relates to a cathode unit for a magnetron sputtering apparatus and a magnetron sputtering apparatus including the cathode unit.

BACKGROUND ART

In a process of manufacturing a semiconductor device, for example, there is a process of forming a copper film on a substrate surface including an inner surface (an inner wall and a bottom surface) of a recessed portion by using a silicon wafer having the recessed portion such as a via hole or a trench formed on a surface thereof as a substrate to be treated (hereinafter, simply referred to as a "substrate"), and in such a film forming step, a magnetron sputtering apparatus is generally used. A magnetron sputtering apparatus of this type includes a vacuum chamber in which a substrate is disposed and a cathode unit is provided in the vacuum chamber. The cathode unit includes a target set in a posture right opposed to the substrate and facing the inside of the vacuum chamber and a magnet unit disposed on a side opposed to a sputtering surface of the target.

As the magnet unit, a magnet unit is usually used which includes a first magnet body in which a single or a plurality of magnet pieces having a cylindrical contour are arranged in an annular or heart shape and a second magnet body in which a plurality of magnet pieces are arranged in a row to surround the periphery of the first magnet body at equal intervals, volumes being designed equivalent (1:1) when converted into the same magnetization in the first magnet body and the second magnet body (so-called balanced magnet). A leakage magnetic field in which a position where a vertical component of the magnetic field becomes zero is closed endlessly by the magnet unit locally acts on a space in front of the sputtering surface located between the target center and the outer edge portion of the target (see, for example, Patent Literature 1.). When a rare gas (a sputtering gas) such as an argon gas is introduced into the vacuum chamber in a vacuum atmosphere at a predetermined flow rate and, for example, DC power having negative potential is applied to the target, endless plasma is generated unevenly from the center of the target in the space in front of the sputtering surface. Consequently, the sputtering surface of the target is sputtered by ions of the sputtering gas ionized by the plasma. During the sputtering, by rotationally driving the magnet unit at predetermined rotating speed around an axis passing the center of the target, a copper film can be formed with good covering properties over the entire surface of the substrate including the inner surface of the recess.

When the target is sputtered as explained above, a non-eroded region not substantially eroded by the sputtering remains in the center region of the target. In the non-eroded region, as the sputtering progresses, sputtering particles adhere again to form a so-called re-deposition film. For example, the re-deposition film becomes a generation source of particles and causes a decrease in product yield. For this reason, there is a problem in that the re-deposition film having a predetermined thickness or more has to be efficiently removed before being formed. On the other hand, in recent years, according to further refining of a wiring pattern, a recess as a film formation target also has a higher aspect ratio. For this reason, it is also necessary to make it possible to form a film with good covering properties over the entire surface of the substrate including the inner surface of the recess having the high aspect ratio, that is, to satisfy a requirement for improvement in coverage.

CITATION LIST

Patent Literature

Patent Literature 1: JP 2004-269952 A

SUMMARY OF INVENTION

Technical Problems

In view of the above points, an object of the present invention is to provide a cathode unit for a magnetron sputtering apparatus and a magnetron sputtering apparatus that, while having a function of being able to periodically remove a re-deposition film formed in a non-eroded region remaining in a center region of a target, can form a film with good covering properties over the entire surface of a substrate including a recess having a high aspect ratio.

Solution to Problem

In order to solve the above problems, a cathode unit for a magnetron sputtering apparatus according to the present invention includes first and second magnet units that are disposed on a side opposed to a sputtering surface of a target set in a posture facing an inside of a vacuum chamber and are respectively driven to rotate around an axis extending in a direction orthogonal to the sputtering surface, the first magnet unit is configured to cause a first leakage magnetic field, in which a position where a vertical component of a magnetic field becomes zero, to act on a space in front of the sputtering surface including a center of the target inward, and the second magnet unit is configured to cause a second leakage magnetic field, in which a position where the vertical component of the magnetic field becomes zero, to act locally on the space in front of the sputtering surface located between the center of the target and an outer edge portion of the target, and also to enable self-holding discharge under low pressure of the plasma confined by the second leakage magnetic field.

In the present invention, the first magnet unit can adopt a configuration that disables self-discharge under low pressure of plasma confined by the first leakage magnetic field. On the other hand, the first magnet unit can adopt a configuration including a driving unit that moves the first magnet unit and the second magnet unit respectively in directions of approaching and separating from the sputtering surface of the target.

In addition, in order to solve the above problems, a magnetron sputtering apparatus of the present invention includes: the cathode unit for the magnetron sputtering apparatus described above; a vacuum chamber in which a target of the cathode unit is set in a posture facing an inside thereof and a substrate to be treated is disposed; a sputtering power supply for supplying power to the target; gas introducing means for enabling introduction of a sputtering gas into the vacuum chamber in a vacuum atmosphere; and a shield plate that is set to surround a front of the target in the vacuum chamber and to which predetermined potential is applied. In this case, it is possible to adopt a configuration in further comprising: in the vacuum chamber a stage on which the substrate to be treated; and a bias power supply for supplying bias power to the stage is provided.

According to the above, after the cathode unit is set in a posture in which the target faces the inside of the vacuum chamber, the inside of the vacuum chamber is evacuated to a predetermined pressure. A rare gas (a sputtering gas) such as an argon gas is introduced into the vacuum chamber in the vacuum atmosphere at a predetermined flow rate and, for example, DC power having negative potential is input to the target. Then, endless first plasma is generated in the space in front of the sputtering surface including the center of the target inward and endless second plasma is generated unevenly from the center of the target in the space in front of the sputtering surface located between the center of the target and the outer edge portion of the target. At this time, for example, when the first magnet unit is configured to disable self-discharge under low pressure of plasma, thereafter, if the introduction of the sputtering gas is stopped in a state in which the inside of the vacuum chamber is evacuated, the first plasma disappears and, on the other hand, the second plasma performs self-holding discharge under low pressure. A portion of the sputtering surface substantially coinciding with a projection surface of the second plasma is mainly sputtered by argon ions in the second plasma and, during the sputtering, the second magnet unit is driven to rotate at predetermined rotating speed around an axis passing the center of the target (that is, turn on the same circumference centering on the center of the target.), whereby a film is formed with good covering properties over the entire surface including the inner surface of the recess on the substrate arranged in a posture in which a film forming surface faces the target side (a film forming step). Note that, for example, the substrate may be covered with a shutter or the like until the self-holding discharge is stabilized under the low pressure of the second plasma. Subsequently, when a re-deposition film having a predetermined thickness or more is formed because the non-eroded region remains in the center region of the target, a sputtering gas is introduced at a predetermined flow rate and DC power is applied to generate the first plasma and the second plasma, and the first plasma and the second plasma are maintained for a predetermined time as explained above. Consequently, the re-deposition film formed on the sputtering surface is also sputtered to be removed by argon ions in the first plasma (a removing step).

In this way, in the present invention, for example, in order to form a copper film with good covering properties over the entire surface of the substrate including the inner surface of the recess having a high aspect ratio, it is advantageous to use a self-holding discharge technique that can realize high density of plasma. In order to generate a leakage magnetic field having high electron confinement ability, as a magnet unit at this time, attention is paid to use of a so-called imbalance magnet in which volume is different when being converted into the same magnetization between the first magnet body and the second magnet body unlike the conventional example. By adopting the above configuration, a film can be formed with good covering properties over the entire surface of the substrate having the recess having a high aspect ratio while having a function of capable of periodically removing the re-deposition film formed in the non-eroded region remaining in the center region of the target. Moreover, the first plasma for removing the re-deposition film and the second plasma used for film formation on the substrate are separately generated by the first and second magnet units, and the second plasma used in the film forming step always sputters the portion of the sputtering surface located on the same circumference. Therefore, a deficiency that a scattering distribution of sputtering particles greatly changes after the removing step.

It is preferable that the first magnet unit and the second magnet unit are disposed at intervals from each other (for example, disposed with a phase shifted by 180° around a rotation axis.) such that magnetic field interference does not occur, and the first magnet unit and the second magnet unit are respectively driven to rotate around the rotation axis in synchronization with each other in both of the film forming step and the removing step. However, depending on a size of the substrate to be formed, an aspect ratio of the recess, and the like, there is a case where the first magnet unit and the second magnet unit have to be disposed close to each other as it is more likely that magnetic field interference occurs in forming the film in the recess with good covering property and surely removing the re-deposition film. In such a case, a configuration including a driving unit that moves the first magnet unit and the second magnet unit respectively in directions approaching and separating from the sputtering surface of the target only has to be adopted.

Consequently, in the film forming step, the first magnet unit is moved by the driving unit to a position separated from the sputtering surface of the target and the second magnet unit is moved by the driving unit to a position close to the sputtering surface of the target such that magnetic field interference does not occur. On the other hand, in the removing step, the second magnet unit is moved by the driving unit to a position separated from the sputtering surface of the target and the first magnet unit is moved by the driving unit to a position close to the sputtering surface of the target such that magnetic field interference does not occur. Consequently, it is possible to form a film with good covering properties over the entire surface of the substrate including the recess having a high aspect ratio while having a function of capable of periodically removing the re-deposition film formed in the non-eroded region remaining in the center region of the target without being affected by magnetic field interference. In this case, the first magnet unit may be either a balance magnet or an unbalance magnet as long as the re-deposition film can be removed by sputtering.

In the magnetron sputtering apparatus, if a shield plate that is installed to surround the front of the target in the vacuum chamber and to which predetermined potential (for example, +5 to 200 V) is applied is provided, it is possible to avoid the first plasma from becoming unstable in the removing step and it is possible to promote ionization of sputtering particles scattered from the target in the film forming step. If bias power is applied to the stage during the sputtering, since ionized sputtering particles are actively drawn into the substrate, a film can be more surely formed with good covering properties over the entire surface of the substrate including the recess having the high aspect ratio. In order to form a film with good covering properties over the entire surface of the substrate including the recess having the high aspect ratio, a collimator may be provided in the vacuum chamber to be located between the target and the substrate.

DESCRIPTION OF EMBODIMENTS

In the following explanation, with reference to the drawings, an embodiment of a cathode unit $CU_1$ for a magnetron sputtering apparatus and a magnetron sputtering apparatus SM including the cathode unit $CU_1$ of the present invention are explained using, as an example, a case where a silicon wafer having a recess such as a via hole or a trench formed on a surface thereof is used as a substrate to be treated (hereinafter referred to as "substrate Sw") as an object to be formed and a copper film is formed on the surface of the substrate Sw. In the following explanation, terms indicating directions such as "up" and "down" are based on FIG. 1A shown in a setting posture of the magnetron sputtering apparatus SM.

Figure 1A:
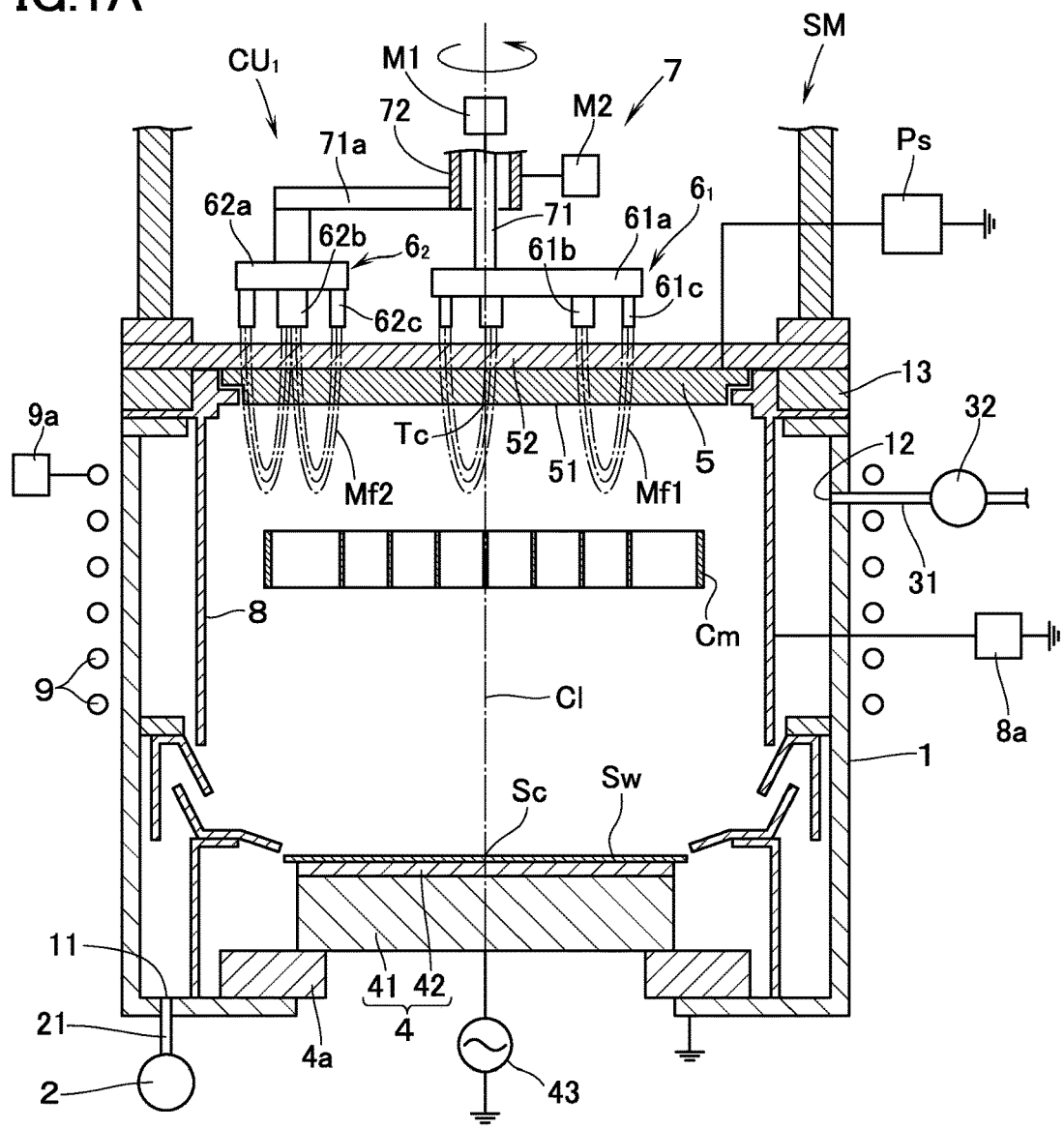
FIG. 1A is a sectional view for explaining a configuration of a magnetron sputtering apparatus in a first embodiment and FIG. 1B is a plan view of a cathode unit in the first embodiment.
Figure 1B:
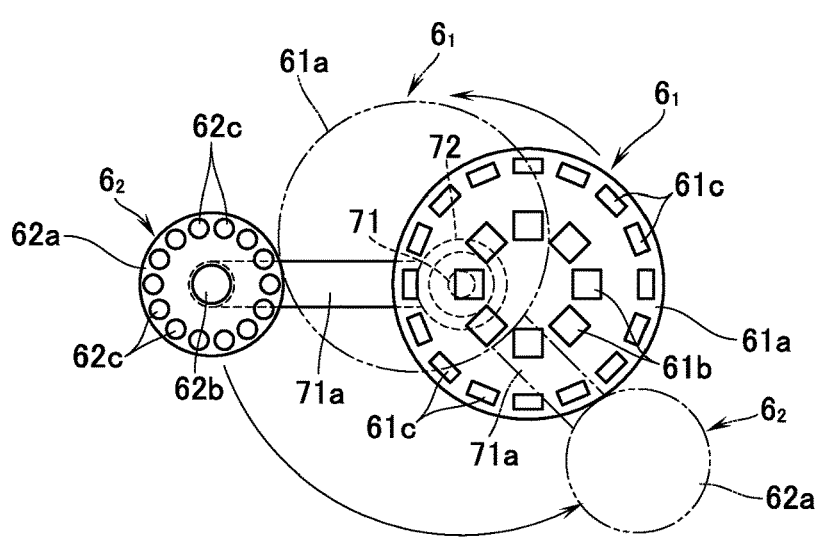

Referring to FIG. 1A and FIG. 1B, the magnetron sputtering apparatus SM of the present embodiment including the cathode unit $CU_1$ of the first embodiment includes a vacuum chamber 1. An exhaust port 11 is opened in the vacuum chamber 1 and one end of an exhaust pipe 21 is connected to the exhaust port 11. The other end of the exhaust pipe 21 is connected to a vacuum pump 2 including a rotary pump, a cryopump, and a turbo molecular pump and the inside of the vacuum chamber 1 can be evacuated to a predetermined pressure. A gas introduction port 12 is also opened in the vacuum chamber 1 and one end of a gas introduction pipe 31 is connected to the gas introduction port 12. The other end of the gas introduction pipe 31 communicates with a not-illustrated gas source via a flow rate regulating valve 32 configured by a mass flow controller or the like. An argon gas (a rare gas) functioning as a sputtering gas, a flow rate of which is controlled, can be introduced into the vacuum chamber 1. In the present embodiment, the gas introduction pipe 31 and the flow rate regulating valve 32 constitute gas introducing means.

In a lower part of the vacuum chamber 1, a stage 4 on which the substrate Sw is placed in a posture with its film formation surface (a surface on which the recess is formed) facing upward is disposed via an insulator 4a. The stage 4 includes a metal base 41 having a cylindrical contour and a chuck plate 42 bonded to the upper surface of the base 41 and can suck and hold the substrate Sw with electrostatic chuck during film formation by sputtering. As the electrostatic chuck, publicly-known electrostatic chuck such as a monopolar type or a bipolar type is used. In this case, a passage for refrigerant circulation and a heater may be assembled to the base 41 to make it possible to control the substrate Sw to a predetermined temperature during film formation. An output from a bias power supply 43 is also connected to the stage 4. Bias power can be supplied to the stage 4 during film formation by sputtering. Note that, although not specifically illustrated and explained, a shutter for preventing adhesion of sputtering particles to the substrate Sw until self-holding discharge is stabilized under low pressure of second plasma explained below may be provided. In an upper part of the vacuum chamber 1, the cathode unit $CU_1$ in the first embodiment is detachably attached to be right opposed to the substrate Sw on the stage 4 such that a target center Tc and a center Sc of the substrate Sw are located on the same axis Cl. A distance between a target 5 and the substrate Sw (a T-S distance) is set in a range of 200 to 1000 mm considering rectilinearity of sputtering particles.

The cathode unit $CU_1$ includes the target 5 made of copper set in a posture facing the inside of the vacuum chamber 1, first and second magnet units $6_1$ and $6_2$ located outside the vacuum chamber 1 and disposed on the upper side opposed to a sputtering surface 51 of the target 5, and a driving unit 7 that drives to rotate each of a first magnet unit $6_1$ and a second magnet unit $6_2$ around the rotation axis Cl orthogonal to the sputtering surface 51 of the target 5. The target 5 is manufactured in a circular shape in a plane view according to the contour of the substrate Sw by a publicly-known method. A backing plate 52 that cools the target 5 during film formation by sputtering is joined to the upper surface of the target 5. The target 5 is attached to an upper part of the vacuum chamber 1 via the insulator 13 in a state of the target 5 is joined to the backing plate 52. As the target 5, a target made of, besides copper, a metal such as aluminum, tantalum, or titanium can also be used. In addition, an output from a publicly-known sputtering power supply Ps is connected to the target 5. DC power (for example, 5 kW to 50 kW) having negative potential or pulse-like DC power can be supplied to the target 5 during film formation by sputtering.

Referring to FIG. 1B as well, the first magnet unit $6_1$ includes a disk-like yoke 61a. On the lower surface of the yoke 61a, a first magnet body 61b in which a plurality of permanent magnet pieces are annularly provided in a row in a circular or heart-shaped contour and a second magnet body 61c in which a plurality of permanent magnet pieces are annularly provided to surround the first magnet body 61b at equal intervals are provided with polarities on the target 5 side (lower surface side thereof) changed from each other. In this case, as the first magnet body 61b and the second magnet body 61c, magnet bodies with volumes designed equivalent (1:1) when being converted into the same magnetization (so-called balanced magnets). A first leakage magnetic field Mf1 in which a position where a vertical component of a magnetic field becomes 0 is closed endlessly is caused to act on a space in front of the sputtering surface 51 including the target center Tc inward and, as explained below, self-discharge under low pressure of plasma confined by the first leakage magnetic field Mf1 is disabled. On the other hand, the second magnet unit $6_2$ includes a disk-like yoke 62a. A third magnet body 62b which is a permanent magnet piece having a cylindrical contour and a fourth magnet body 62c in which a plurality of permanent magnet pieces are annularly provided in a row to surround the third magnet body 62b at equal intervals in the radial direction are provided on the lower surface of the yoke 62a with polarities on the target 5 side (lower surface side thereof) changed from each other. In this case, as the third magnet body 62b, a magnet body with volume designed to be smaller (for example, 1:4) when being converted into the same magnetization compared with the fourth magnet body 62c (so-called unbalanced magnet). A second leakage magnetic field Mf2 in which a position where a vertical component of a magnetic field becomes 0 is closed endlessly is caused to locally act on the space in front of the sputtering surface 51 located between the target center Tc and the outer edge of the target 5 and self-discharge of plasma confined by the second leakage magnetic field Mf2 under low pressure is enabled.

The driving unit 7 includes a solid first rotating shaft 71 and a hollow second rotating shaft 72 disposed concentrically with each other. The first magnet unit $6_1$ is provided at the lower end of the first rotating shaft 71 and the second magnet unit $6_2$ is provided at the lower end of the second rotating shaft 72 via a support arm 71a extending in a direction orthogonal to the rotation axis Cl (a direction extending in parallel to the sputtering surface 51). In this case, the lower end of the first rotating shaft 71 is connected to a position offset in the radial direction from the center of the yoke 61a. The support arm 71a is provided to extend in the opposite direction of a direction offset in the radial direction (that is, a phase is shifted by 180° around the rotation axis Cl such that magnetic field interference between the first magnet unit $6_1$ and the second magnet unit $6_2$ does not occur as much as possible). The lower surfaces of the first magnet body 61b and the second magnet body 61c and the third magnet body 62b and the fourth magnet body 62c are set to be located on the same plane parallel to the sputtering surface 51. Although not particularly illustrated and explained, a publicly-known mechanism that extends and contracts the support arm 71a in the radial direction may be provided in the support arm 71a. The distance from the rotation axis Cl of the first magnet unit $6_1$ may be set variable. The driving unit 7 includes a motor M1 coupled to the first rotating shaft 71 and a motor M2 coupled to the second rotating shaft 72 and can drive to rotate the first rotating shaft 71 and the second rotating shaft 72 at predetermined speed. At this time, rotating speeds of the first magnet unit $6_1$ and the second magnet unit $6_2$ are set such that phases around the rotation axis Cl of the first magnet unit $6_1$ and the second magnet unit $6_2$ are always constant to prevent magnetic field interference from occurring.

In the vacuum chamber 1, a shield plate 8 is set to surround the front of the target 5. Predetermined potential is applied to the shield plate 8 by a DC power supply 8a during film formation by sputtering. Consequently, it is possible to avoid first plasma from becoming unstable because copper atoms ionized in plasma recoil on the shield plate 8 at the time of a removing step explained below. It is possible to promote ionization of sputtering particles (copper atoms) scattering from the sputtering surface 51 of the target 5 toward the substrate Sw at the time of a film forming step. A coil 9 is provided outside the vacuum chamber 1. The coil 9 is energized by a coil power supply 9a to generate a vertical magnetic field (not illustrated) directed from the target 5 toward the substrate Sw to further promote ionization of atoms flying out from the target 5. A collimator Cm is disposed in the vacuum chamber 1 to be located between the target 5 and the substrate Sw. As the collimator Cm, a publicly-known collimator can be used. Therefore, detailed explanation of the collimator Cm is omitted here. In the following explanation, formation of a copper film using the sputtering apparatus SM including the cathode unit $CU_1$ in the first embodiment is explained.

After the substrate Sw is disposed on the stage 4, the inside of the vacuum chamber 1 is evacuated to a predetermined pressure (for example, $10^{-5}$ Pa) by the vacuum pump 2. Argon gas is introduced into the vacuum chamber 1 in a vacuum atmosphere at a predetermined flow rate such that the total pressure in the vacuum chamber 1 is in a range of $10^{-2}$ to 1 Pa. DC power (5 to 50 kW) having negative potential is supplied to the target 5. Then, endless first plasma is generated in the space in front of the sputtering surface 51 including the target center Tc inward. Endless second plasma is generated unevenly from the target center Tc in the space in front of the sputtering surface 51 located between the target center Tc and the outer peripheral edge of the target 5. Thereafter, when the introduction of the argon gas is stopped in a state in which the inside of the vacuum chamber 1 is evacuated, the first plasma disappears and, on the other hand, the second plasma performs self-holding discharge under low pressure. A portion of the sputtering surface 51 substantially coinciding with a projection surface of the second plasma is mainly sputtered by argon ions in the second plasma. The first and second magnet units $6_1$ and $6_2$ are driven to rotate at predetermined rotating speed around the rotation axis Cl during sputtering. Consequently, a copper film is formed with good covering properties over the entire surface of the substrate Sw including the inner surface of the recess (the film forming step). Subsequently, when a re-deposition film (not illustrated) having predetermined thickness or more is formed because the non-eroded region remains in the center region of the target 5, as explained above, a sputtering gas is introduced at a predetermined flow rate, DC power is supplied to generate the first plasma and the second plasma, and the first plasma and the second plasma are maintained for a predetermined time. Consequently, the re-deposition film formed on the sputtering surface 51 is also removed by sputtering by argon ions in the first plasma (the removing step).

According to the above, it is possible to form a copper film with good covering properties over the entire surface of the substrate Sw including the inner surface of the recess by utilizing a self-holding discharge technique that can realize high density of plasma. It is possible to periodically remove the re-deposition film formed in the non-eroded region remaining in the center region of the target 5. Moreover, the first plasma for removing the re-deposition film and the second plasma used for film formation on the substrate Sw are separately generated. The second plasma used in the film forming step always sputters the portion of the sputtering surface 51 located on the same circumference. Therefore, a deficiency that a scattering distribution of sputtering particles greatly changers after the removing step does not occur. Furthermore, since the shield plate 8 to which predetermined potential is applied is provided, it is possible to avoid the first plasma becoming unstable in the removing step. It is possible to promote ionization of sputtering particles (copper atoms) scattering from the target 5 in the film forming step. Since bias power is supplied to the stage 4 during sputtering, the ionized sputtered particles are actively drawn into the substrate Sw, whereby a film can be more surely formed with good covering properties over the entire surface of the substrate Sw including a recess having a high aspect ratio (for example, 2 to 10).

Here, unlike the first embodiment, there is a case where, in forming a film in the recess with good covering properties and surely remove the re-deposition film, the first magnet unit $6_1$ and the second magnet unit $6_2$ have to be disposed close to each other to such an extent that there is a risk that magnetic field interference occurs. Therefore, the cathode unit $CU_2$ in the second embodiment includes a driving unit 70 that moves the first magnet unit $6_1$ and the second magnet unit $6_2$ respectively in directions approaching and separating from the sputtering surface 51 of the target 5 (in FIG. 2A and FIG. 2B, the up-down direction). In the following explanation, a configuration of the cathode unit $CU_2$ in the second embodiment is specifically explained with reference to FIG. 2A and FIG. 2B in which the same members or elements are denoted by the same reference numerals and signs.

Figure 2A:
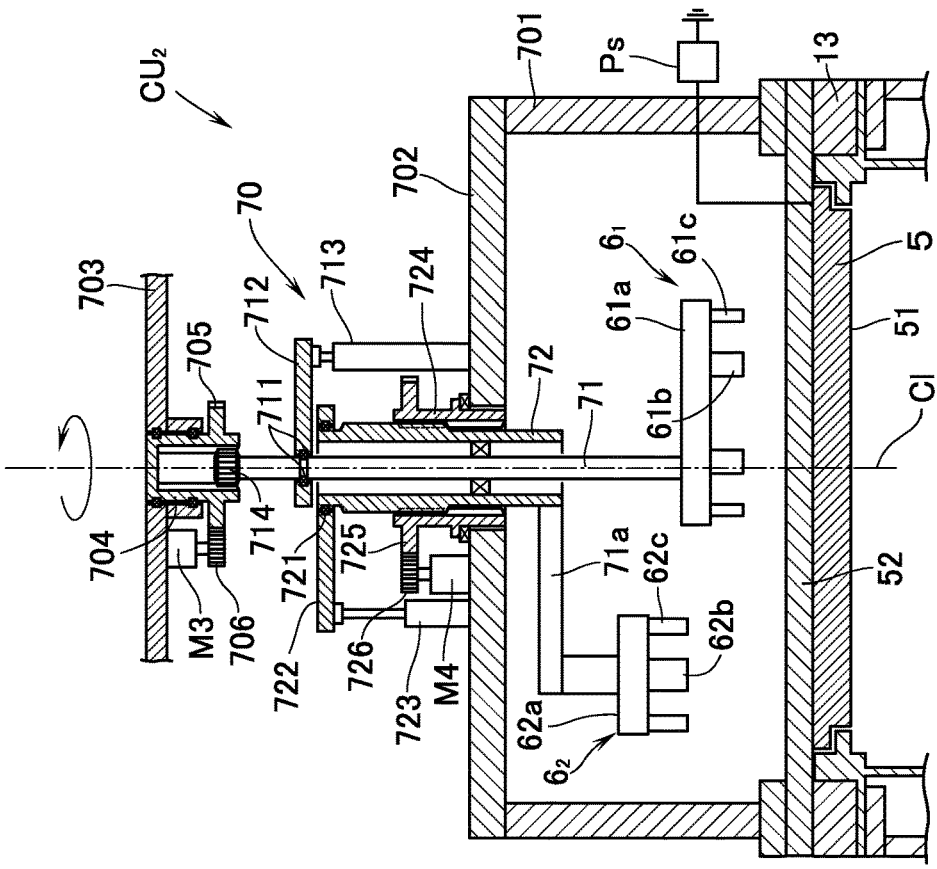
FIG. 2A and FIG. 2B are sectional views for explaining a configuration of a cathode unit in a second embodiment.
Figure 2B:
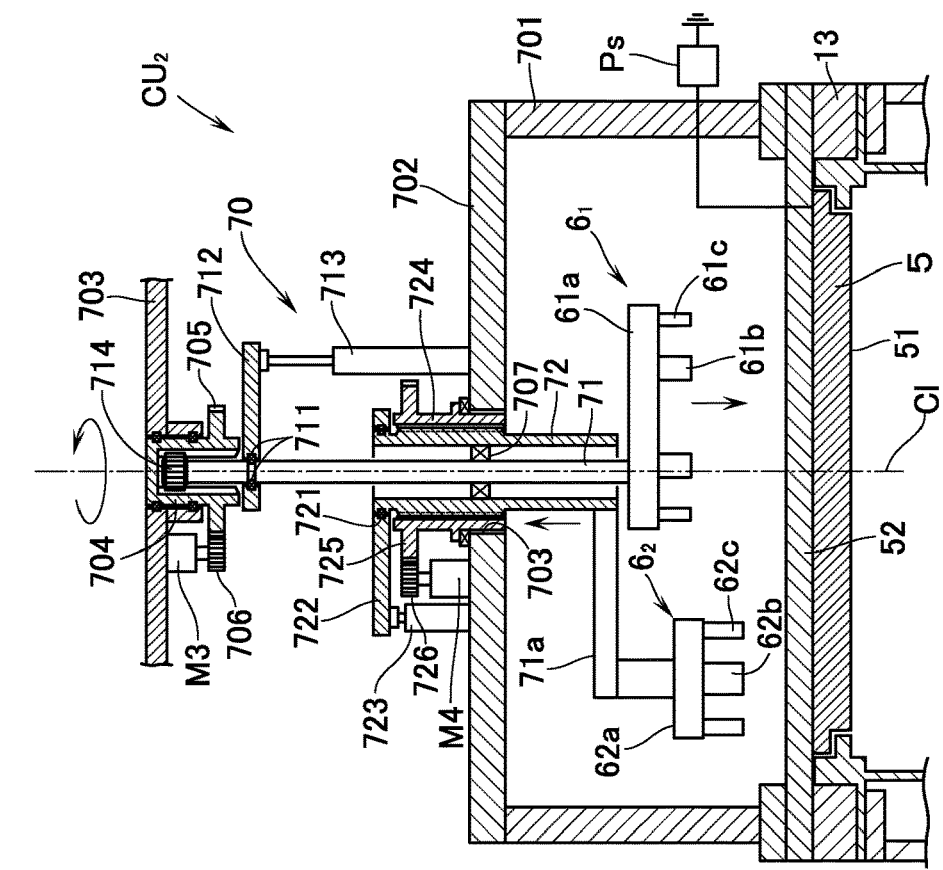

As illustrated in FIG. 2A and FIG. 2B, the cathode unit $CU_2$ in the second embodiment includes a support frame 701 provided on the backing plate 52. An attachment opening 703 through which the first rotating shaft 71 and the second rotating shaft 72 are inserted is formed in a first support plate section 702 of the support frame 701 disposed in parallel to the sputtering surface 51. A first driving plate 712 including a bearing 711 that supports the first rotating shaft 72 is connected to a portion of the first rotating shaft 71 protruding upward from the second rotating shaft 71. The first driving plate 712 is moved up and down by driving means 713 such as an air cylinder or a linear motion motor provided in the first support plate section 702. An upper end portion 714 of the first rotating shaft 71 is formed as a spline shaft section and is engaged with a sleeve-like first ball spline nut 704 attached to a second support plate section 703 of the support frame 701 disposed in parallel to the first support plate section 702. A first gear 705 is formed on the outer peripheral surface of the first ball spline nut 704. A second gear 706 provided in an output shaft of a motor M3 is meshed with the first gear 705. Consequently, the first rotating shaft 71 is driven to rotate at predetermined speed by driving to rotate the motor M3. In this case, the first rotating shaft 71 may be supported by a bearing 707 provided on the inner surface of the second rotating shaft 72.

A second driving plate 722 including a bearing 721 that supports the second rotating shaft 72 is coupled to the second rotating shaft 72. The second driving plate 722 is moved up and down by driving means 723 such as an air cylinder or a linear motion motor provided in the first support plate section 702. The upper end portion of the second rotating shaft 72 located upward from the attachment opening 703 is formed as a spline shaft section (not illustrated) and is engaged with a sleeve-like second ball spline nut 724, the lower end of which is inserted into the attachment opening 703. A first gear 725 is formed on the outer peripheral surface of the second ball spline nut 724. A second gear 726 provided on the output shaft of the motor M4 is meshed with the first gear 725. Consequently, the first rotating shaft 71 is driven to rotate at predetermined speed by driving to rotate the motor M4.

According to the above, after the substrate Sw is disposed on the stage 4, the inside of the vacuum chamber 1 is evacuated to a predetermined pressure by the vacuum pump 2. At this time, the first magnet unit $6_1$ is raised to a position separated from the backing plate 52 by the driving unit 70 and the second magnet unit $6_2$ is lowered to a position close to the backing plate 52 such that only the second leakage magnetic field Mf2 acts in the front (in FIG. 2A and FIG. 2B, a lower space) of the sputtering surface 51. Argon gas is introduced into the vacuum chamber 1 in the vacuum atmosphere at a predetermined flow rate such that the total pressure in the vacuum chamber 1 is in a range of $10^{-2}$ to 1 Pa. DC power (5 to 50 kW) having negative potential is supplied to the target 5. Then, only the endless second plasma is generated unevenly distributed from the target center Tc in the space in front of the sputtering surface 51 located between the target center Tc and the outer edge of the target 5. Thereafter, when the introduction of the sputtering gas is stopped in a state in which the inside of the vacuum chamber 1 is evacuated, the second plasma performs self-holding discharge under low pressure. Consequently, the portion of the sputtering surface 51 substantially coinciding with the projection surface of the second plasma is mainly sputtered by argon ions in the second plasma. The second magnet unit $6_2$ is driven to rotate at predetermined rotating speed around the rotation axis Cl during sputtering. At this time, the first magnet unit $6_1$ is driven to rotate at predetermined rotating speed around the rotation axis Cl. Similarly to the above, predetermined potential (for example, +5 to 200 V) is applied to the shield plate 8 and the coil 9 is energized (for example, 0.5 to 15 A) to generate a magnetic field perpendicular to the sputtering surface 51. Bias power in a range of 10 to 1000 W is input to the stage 4. Consequently, a film is formed on the substrate Sw with good covering properties over the entire surface of the substrate Sw including the inner surface of the recess (the film forming step).

Subsequently, when a re-deposition film having a predetermined thickness or more is formed because the non-eroded region remains in the center region of the target 5, the second magnet unit $6_2$ is raised by the driving unit 70 to a position separated from the backing plate 52 and the first magnet unit $6_1$ lowered by the driving unit 70 to a position close to the backing plate 52 such that the first leakage magnetic field Mf1 acts in the front (in FIG. 1A and FIG. 1B, the lower space) of the sputtering surface 51. In a state in which a dummy substrate (not illustrated) is placed on the stage 4, similarly to the above, argon gas is introduced at a predetermined flow rate such that the total pressure of the dummy substrate is in a range of $10^{-2}$ to 1 Pa. DC power (5 to 50 kW) having negative potential is supplied to the target 5. At this time, it is preferable to apply predetermined potential (for example, +5 to 200 V) to the shield plate 8 in order to achieve stability of discharge. Consequently, the re-deposition film is sputtered and removed by argon ions in the first plasma (the removing step). In this case, the first magnet unit $6_1$ only has to be a magnet that can remove the re-deposition film by sputtering and may be either a balance magnet or an unbalance magnet.

The embodiment of the present invention is explained above. However, various modifications can be made without departing from the scope of the technical idea of the present invention. In the embodiment, an example is explained in which the substrate to be treated is the silicon wafer in which the recess such as a via hole or a trench is formed on the surface of the silicon wafer. However, the present invention is not limited to this and can be widely applied to a case where a predetermined metal film is formed on the surface of the substrate to be treated with good in-plane uniformity of film thickness. In the embodiment, an example is explained in which the two magnet units $6_1$ and $6_2$ are provided. However, the present invention is not limited to this and can also be applied when three or more magnet units are provided. In the embodiment, an example is explained in which the permanent magnet pieces are used as the first and second magnet units $6_1$ and $6_2$. However, the present invention is not limited to this. For example, a part of the permanent magnet pieces may be used as an electromagnet and energization to the electromagnet may be controlled as appropriate to make it possible to switch the first and second magnet units $6_1$ and $6_2$ as appropriate between a balance magnet and an imbalance magnet.

REFERENCE SIGNS LIST $CU_1$, $CU_2$ Cathode unit for magnetron sputtering apparatus
SM Magnetron sputtering apparatus
Sw Substrate (Substrate to be treated)
1 Vacuum chamber
31 Gas introduction pipe (component of gas introducing means)
32 Flow rate regulating valve (component of gas introducing means)
4 Stage
43 Bias power supply
5 Target
51 Sputtering surface
Ps Sputtering power supply
$6_1$ First magnet unit
$6_2$ Second magnet unit
Cl Axis
Mf1 First leakage magnetic field
Mf2 Second leakage magnetic field 7, 70 Driving unit
8 Shield plate

The invention claimed is:

1. A cathode unit for a magnetron sputtering apparatus, comprising first and second magnet units that are disposed on a side opposed to a sputtering surface of a target set in a posture facing an inside of a vacuum chamber and are respectively driven to rotate around an axis extending in a direction orthogonal to the sputtering surface, wherein
the first magnet unit having a first pair of magnets is configured to cause a first leakage magnetic field, in which a position where a vertical component of the first leakage magnetic field becomes zero forms a closed loop, to act on a first space in front of the sputtering surface including a center of the target inward,
the second magnet unit having a second pair of magnets is configured to cause a second leakage magnetic field, in which a position where a vertical component of the second leakage magnetic field becomes zero forms a closed loop, to act locally unevenly from the target center on a second space in front of the sputtering surface located between the target center and an outer edge of the target, and also to enable self-holding discharge under low pressure of plasma confined by the second leakage magnetic field,
the cathode unit further comprising a driving unit configured to move the second magnet unit to a position close to the sputtering surface of the target, and configured to move the first magnet unit and the second magnet unit to a position so that magnetic field interference does not occur, and
the second magnet unit is provided via a support arm extending contractible in a radial direction from the axis.

2. The cathode unit for a magnetron sputtering apparatus according to claim 1, wherein the first magnet unit is configured to disable self-holding discharge under low pressure of plasma confined by the first leakage magnetic field.

3. The cathode unit for a magnetron sputtering apparatus according to claim 1, wherein the driving unit that moves the first magnet unit and the second magnet unit independently in directions of approaching and separating from the sputtering surface of the target.

4. The cathode unit for a magnetron sputtering apparatus according to claim 1, wherein the second magnet unit is provided via the support arm extending in parallel to the target.

5. The cathode unit for a magnetron sputtering apparatus according to claim 4, wherein the first magnet unit is provided at a first rotating shaft.

6. The cathode unit for a magnetron sputtering apparatus according to claim 1, wherein the second magnet unit is provided via the support arm extending contractible in the radial direction from the axis and in parallel to the target.

7. A magnetron sputtering apparatus comprising:
the cathode unit for a magnetron sputtering apparatus according to claim 1;
the vacuum chamber in which the target of the cathode unit is set in a posture facing an inside thereof and a substrate to be treated is disposed;
a sputtering power supply for supplying power to the target;
gas introducing means for enabling introduction of a sputtering gas into the vacuum chamber in a vacuum atmosphere; and
a shield plate that is set to surround a front of the target in the vacuum chamber and to which predetermined potential is applied.

8. The magnetron sputtering apparatus according to claim 7, further comprising: in the vacuum chamber a stage on which the substrate to be treated is placed; and a bias power supply for supplying bias power to the stage is provided.

* * * * *